United States Patent [19]

Clemo

[11] Patent Number: 5,714,809
[45] Date of Patent: Feb. 3, 1998

US005714809A

[54] SOFT SWITCHING CIRCUIT WITH CURRENT-MODE CONTROL

[75] Inventor: Raymond Mathew Clemo, Raleigh, N.C.

[73] Assignee: International Business Machines Corporation, Armonk, N.Y.

[21] Appl. No.: 542,152

[22] Filed: Oct. 12, 1995

[51] Int. Cl.⁶ .................................................... H01H 47/00
[52] U.S. Cl. ........................ 307/125; 307/147; 395/283; 361/58
[58] Field of Search .............................. 307/125, 126, 307/130, 131, 112, 11 C, 147; 395/280, 281, 282, 283; 361/58

[56] References Cited

U.S. PATENT DOCUMENTS

| | | | |
|---|---|---|---|
| 4,079,440 | 3/1978 | Ohnuma et al. | 361/424 |
| 4,245,270 | 1/1981 | Busby | 361/58 |
| 4,999,787 | 3/1991 | McNally et al. | 364/514 |
| 5,077,675 | 12/1991 | Tam | 364/480 |
| 5,101,313 | 3/1992 | Neilson et al. | 361/10 |
| 5,155,648 | 10/1992 | Gauthier | 361/58 |
| 5,268,592 | 12/1993 | Bellamy et al. | 307/43 |
| 5,272,584 | 12/1993 | Austruy et al. | 361/58 |
| 5,283,707 | 2/1994 | Conners et al. | 361/58 |

OTHER PUBLICATIONS

IBM Technical Disclosure Bulletin, vol. 34, No. 4A, Sep. 1991 "Hot-Plug Circuit" P. K. Egan.
IBM Technical Disclosure Bulletin, vol. 37, No. 06B, Jun. 1994 "Scheme for Low Loss Hot Plugging and Fault Protection in Switch Mode Power" S. D. Keidi.

Primary Examiner—William M. Shoop, Jr.
Assistant Examiner—Jonathan S. Kaplan
Attorney, Agent, or Firm—Steven B. Phillips; William G. Dosse

[57] ABSTRACT

A hot-plugging circuit for controlling the rate of application or withdrawal of both voltage and current to a user circuit to permit power up or down of the user circuit either to conserve energy usage in operation or to facilitate non-disruptive insertion or extraction of the user circuit from a larger, continually-powered, circuit. A semiconductor switch is used as the principle current and voltage control element. Current through the switch is monitored during transitions, and is converted to a voltage level. A voltage ramp relative to the voltage applied to the user circuit is generated and compared with the current representing voltage level to generate a control signal for controlling the rate of turn ON or turn OFF of the semiconductor switch. The voltage ramp generation is controlled by an ON/OFF control voltage level. Undervoltage occurring after a turn-ON transition is sensed and causes turn-OFF of the semiconductor switch in order to avoid operational deficiencies of the user circuit due to inadequate supply voltage.

24 Claims, 4 Drawing Sheets

FIG. 1B

SOFT SWITCHING CIRCUIT WITH CURRENT-MODE CONTROL

FIELD OF THE INVENTION

The present invention relates to controlling the electrical power applied to a circuit, as when a circuit board is plugged into or unplugged from a larger circuit system or when the circuit is temporarily not needed, all in the presence of the continuous supply of electrical voltage. More particularly, the present invention relates to turning "ON" or turning "OFF" the voltage supplied to the circuit, in a gentle or gradual manner, in order better to manage power usage and in order to limit the amount of current suddenly flowing into the circuit and to limit sudden changes in the voltage supply at and shortly after connection or disconnection of the circuit board so as to prevent arcing and disruption of the electrical circuit environment.

BACKGROUND OF THE INVENTION

There is almost an unlimited variety of situations in which it is desirable to plug a circuit board into a larger circuit without first turning off the power to the larger circuit. The most common situation is some form of stored-program controller or computer such as a telephone switching system, a main-frame computer, or a LAN file server, all of which must often remain in operation twenty-four hours a day, every day. However, many circuit boards can either be damaged by an uncontrolled application or interruption of electrical voltage; can emit spurious signals that could disrupt the larger circuit; can draw such high surges of supply current, such as to charge various on-board capacitances, or can suddenly reduce the current flowing in the power busses if unplugged from the larger circuit, that the supply voltages can experience sudden dips or surges, often with unpredictable consequences. Also, many of the latest computers have so-called "green" modes in which portions of the circuitry are disabled, either with power reduced or completely turned off when not needed, so as to conserve electrical power, especially if battery-operated.

Such situations and problems are not new, and quite a few "soft-switch" or "hot-plugging" circuits have been developed in an effort to control the sudden application or removal of supply voltage and current to a circuit board as it is plugged into or unplugged from a larger circuit. U.S. Pat. No. 5,272,584, granted on Dec. 21, 1993, to Austruy, et al., discloses or references several examples of such soft-switch circuits.

One group of soft-switch circuits uses plug connector contacts of different lengths so that, when inserting or extracting a circuit board, some connections are made or broken before others. In one type of such a circuit, a first-to-make-and-last-to-break contact applies voltage to the circuit board through a resistive-capacitive (RC) circuit or may use active electronic components controlled by an RC circuit. This causes a more controlled and gradual rise of the voltage applied to the circuit board's main circuitry. The capacitance also allows a more gradual decay of current flow when the circuit board is extracted. A last-to-make-and-first-to-break contact then bypasses the RC circuit. Besides the need for special connectors having contacts of different lengths, this type of soft-switch circuit depends on the plugging-in and extracting operation not being too fast, in order to allow the RC circuit to do its job before the last-to-make-and-first-to-break contact bypasses the RC circuit or separates from the mating connector.

A more complex type of soft switch circuit for use with different length contacts uses active components to control and ramp the rise of the voltage applied to the circuit board. However, this type of soft switch circuit has some of the same limitations as the abovementioned type that uses passive components. Also, many capacitive portions of a circuit board have current-vs-voltage characteristics that are not linearly proportional. Often, there is a sudden surge of current demand by a circuit board just as the applied supply voltage reaches its peak. An example of such a hot-plugging circuit with active components is disclosed in U.S. Pat. No. 4,245,270 granted to Busby on Jan. 15, 1981.

When active components are used in a soft switch circuit, design possibilities present themselves to allow the circuit designer to obviate the use of a specialized connector with contacts of different lengths. However, without different length connector contacts, the circuit board has no way of physically bypassing the soft switch circuit once full supply voltage has been reached. Therefore, active voltage-sensing and switching components with extremely low impedance must be used. This can add significantly to problems of circuit cost, size, and reliability.

Volume 37, Number 6B—June, 1994 page 367 of the IBM Technical Disclosure Bulletin discloses a Hot Plugging scheme for a power voltage converter. When first plugged in, an RC time constant slowly turns ON a series-connected Field-Effect Transistor (FET) until enough voltage is available through the series FET to start the power oscillator FET of the converter. The power oscillator FET output then also drives a charge pump to continue control of the turn-on rate of the series FET and serves to keep it on.

Many soft switches are provided on the load side of the plug. That is, they are mounted on the plug-in card. An example of a soft-switch circuit is shown in the IBM Technical Disclosure Bulletin Volume 34, Number 4A—September, 1991 page 9, which discloses a FET as the current-control switching element of a circuit that is designed to be placed on the source side of the plug, rather than on the load side.

When a defective plug-in board circuit is provided with a soft switch, it may draw so much current that if adversely affects the entire, larger electronic system. Few, indeed are the soft-switch circuits that will address such a situation short of a simple fuse or adding still more resistive circuitry in the main conduction path from the larger circuit to the plug-in board's circuit.

SUMMARY OF THE INVENTION

It is an object of the present invention to turn ON and/or turn OFF the voltage and current to a user circuit in a controlled manner either in connection with idle periods of the user circuit or in connection with insertion or withdrawal of the user circuit with respect to a larger circuit which is in operation at the time.

In connection with one aspect of the present invention, for controlling the transition of voltage and current supplied to a user circuit, a current-controlling switch connected between a power source and the user circuit has a current path, the conductivity of which is controlled in response to measuring the current flowing through the switch and a voltage ramp generator, all in response to an enabling signal.

In connection with a hot-plugging circuit for use with a printed circuit board, the voltage on a power control conductor controls a voltage output of a voltage-ramp generating circuit to control the conductivity of a semiconductor switch via a comparison with a measure of the level of current flowing through the switch.

In another aspect of the present invention, the transition of the current and voltage supplied to and withdrawn from a user circuit is controlled by a semiconductor switch connected between a voltage source and the user circuit. The conductivity of the switch is in turn controlled by the combination of a measure of the current flowing through the switch and a voltage ramp generated in response to an ON/OFF input control signal.

It is another object of the present invention to monitor and limit the amount of current that can be drawn by the user circuit. By current limiting the conductivity of the semiconductor switch, the semiconductor switch becomes a current source. A demand by the user circuit for more than the permitted current results in a sharp reduction in the voltage supplied to the user circuit. Therefore, a mere measurement of the user circuit's input voltage will sense an overcurrent condition an shut down the power being sent to the user circuit.

BRIEF DESCRIPTION OF THE DRAWINGS

A more complete understanding of the present invention will be had from the following detailed description when considered in conjunction with the accompanying drawings, wherein the same reference numbers refer to the same or corresponding parts shown throughout the several figures, in which.

DETAILED DESCRIPTION OF THE BEST MODE AND INDUSTRIAL APPLICABILITY

Figure 1:
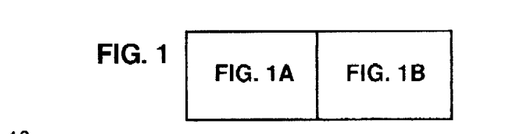
FIGS. 1A and 1B are to be placed next to one another to show a schematic circuit diagram of the preferred embodiment of a hot-plugging circuit according to the present invention.
Figure 1A:
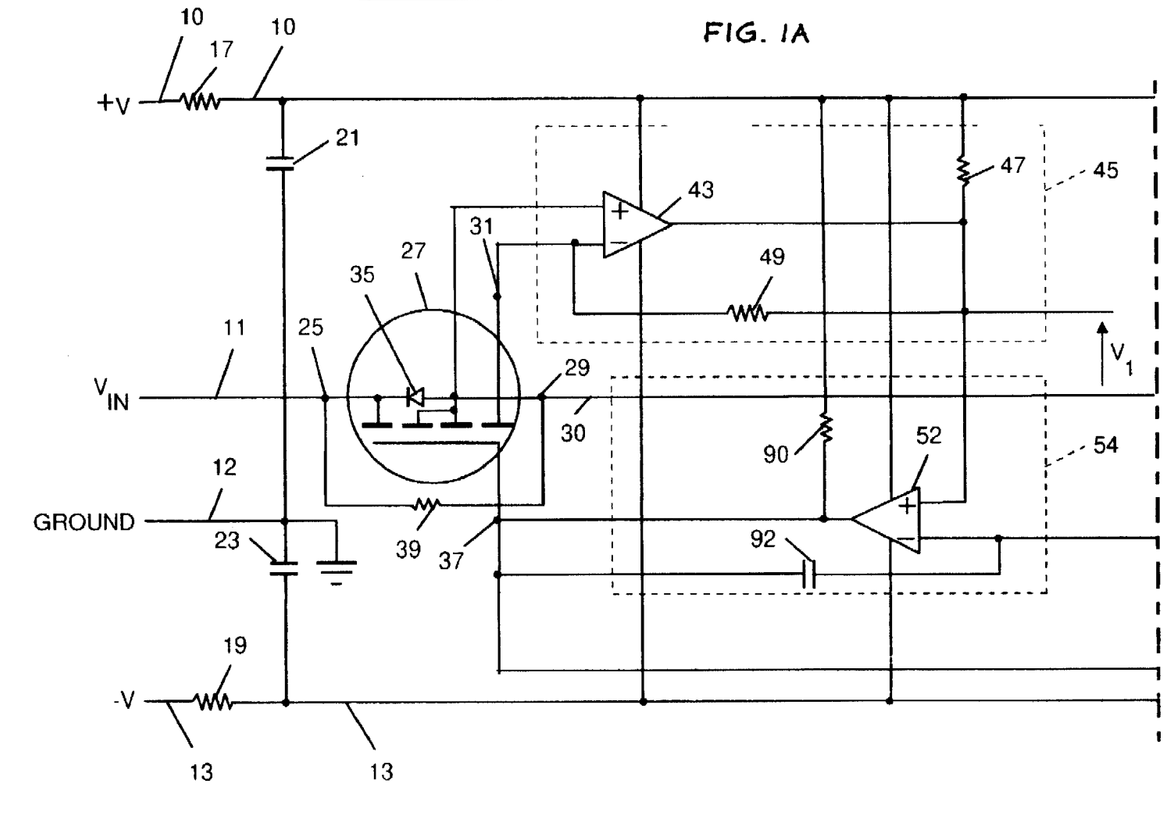
Figure 1B:
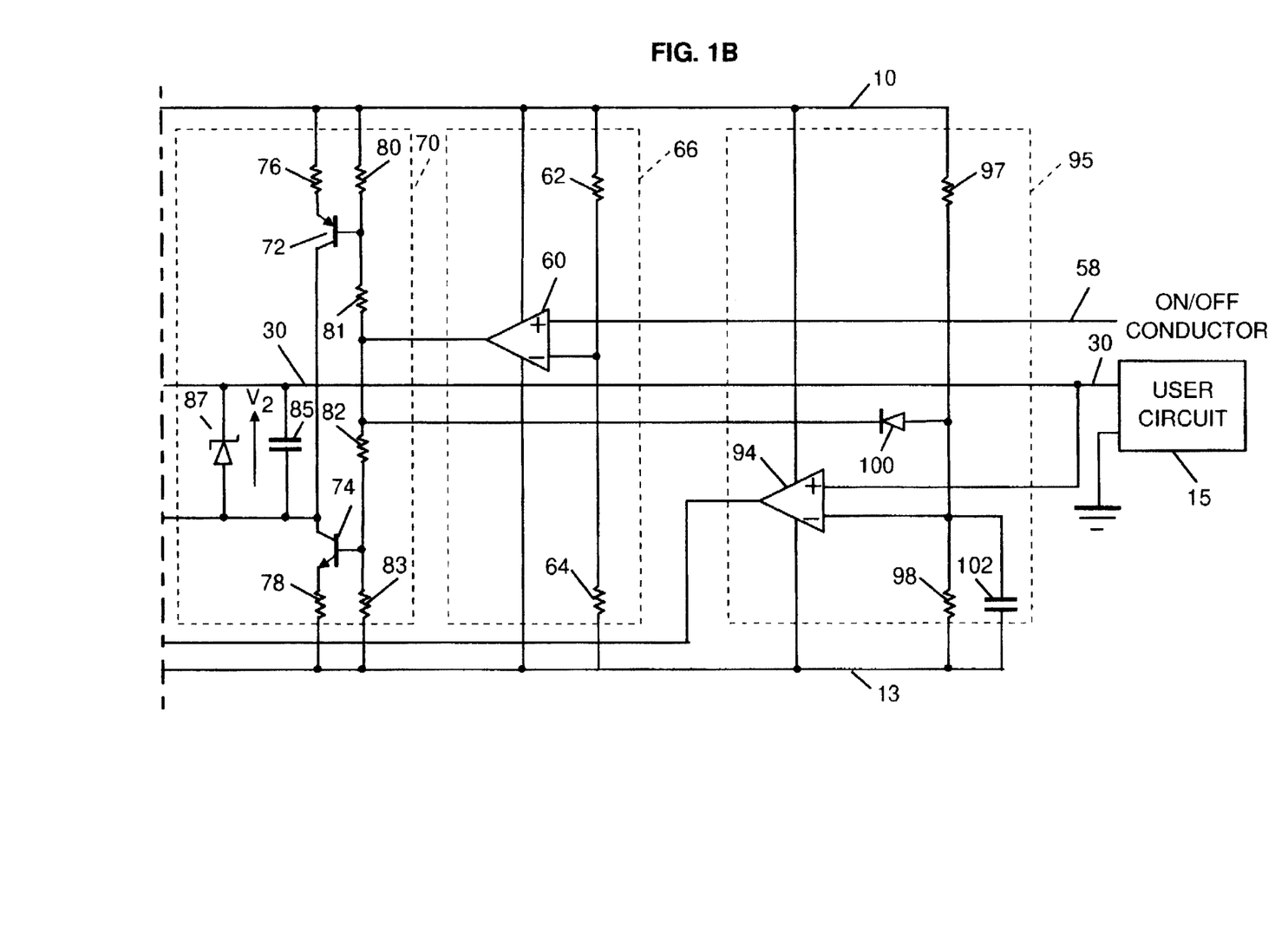
Figure 3:
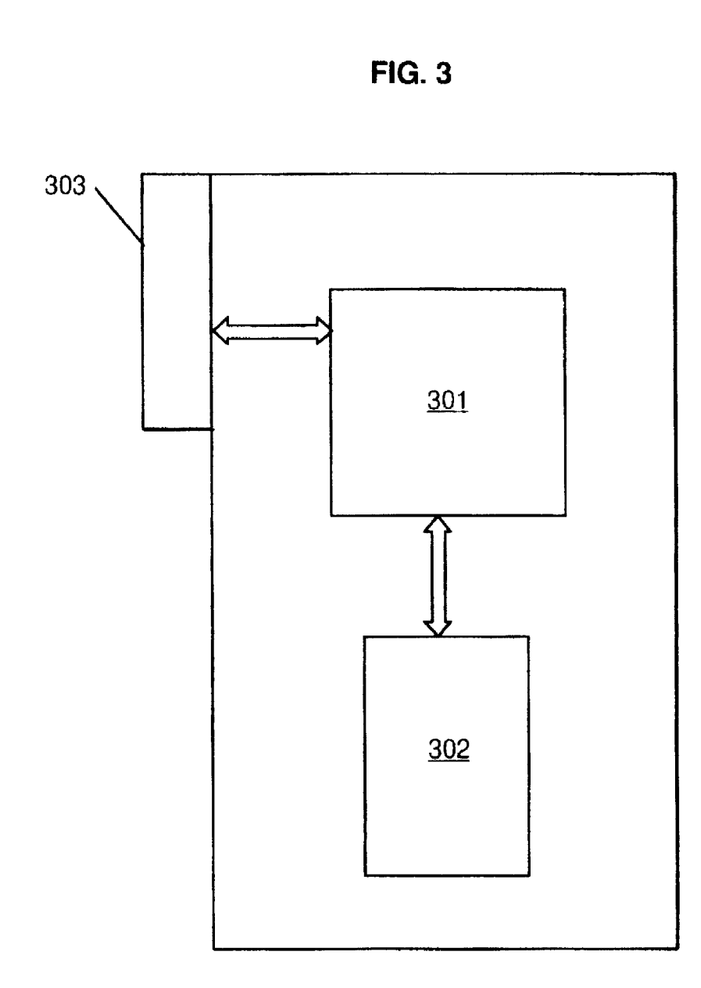
FIG. 3 shows a printed-circuit board on which the circuit according to the present invention is used.

Referring now to the accompanying drawings and more particularly to FIGS. 1A and 1B, which are to be placed next to one another, there is shown a hot-plugging circuit for use on a printed-circuit board. The purpose of the hot-plugging circuit is to control the turn-on and turn-off transients of voltage and current as the printed-circuit board is plugged into and out of a larger circuit (not shown) that is in a fully-powered, operating condition. FIG. 3 shows such a printed circuit board which contains the hot-plugging circuit 301, a user circuit 302, and a card-edge connector 303. At the left in FIG. 1A are four conductors 10, 11, 12, and 13 which represent, inter alia, the operative power source extending to a user circuit 15 (FIG. 1B) from a bus (not shown) that interconnects the elements of the larger circuit. The user circuit 15 constitutes the load which is to be powered from the conductor 11 through the hot-plugging circuit.

The conductors 10 and 13 connect to the bus; and the supply, respectively, positive (+) and negative (−) operational voltage to operate the hot-plugging circuit. The conductor 12 provides a common return or ground connection. The conductor 11 carries power that is supplied, ultimately, to the user circuit 15 through the hot-plugging circuit of FIGS. 1A and 1B.

Electrical voltage and current are supplied from the operational voltage supply conductors 10 and 13 through two resistors 17 and 19, respectively, which connect to and cooperate with one terminal each of two filter capacitors 21 and 23, respectively, to filter voltage perturbations from the conductors 10 and 13, respectively. The other terminals of the filter capacitors 21 and 23 are connected to the common ground conductor 12. When the circuit board which includes the hot-plugging circuit of the present invention, if plugged into the larger system (not shown) with which it is to function, there is no voltage difference across the capacitors 21 and 23. However, when the circuit board is plugged into the larger circuit, those filter capacitors 21 and 23 quickly charge through their respective resistors 17 and 19 to substantially the voltage of their respective conductors 10 and 13. Therefore, no further distinction will be made between the conductor 10 as represented to the left of the resistor 17 and to the right of resistor 17, in FIG. 1A. The same holds true for the conductor 13.

THE CURRENT-SENSING POWER FET

The positive or plus (+) power supply conductor 11, in order ultimately to supply a positive voltage to the user circuit 15, is connected to the drain terminal 25 of a metal-oxide semiconductor field-effect transistor (MOSFET), or simply a semiconductor switch 27. The semiconductor switch 27 is of high-current type that has a very large number of source areas on its operative surface, most of which are connected in parallel to a source terminal 29 of the semiconductor switch 27. The source terminal 29 is connected by a conductor 30 directly to the user circuit 15.

A small number of the source areas on the surface of the semiconductor switch 27 are connected to a sense terminal 31. That small number of source areas captures a small number of charges passing through the conductive channels of the small number of source areas of the FET switch 27 that are connected to the sense terminal 31. The number of such captured charges is very nearly proportional to the large number of charges passing through the rest of the conductive channels of the FET switch 27 to the source terminal 29.

Power field-effect transistors (FETs) are well known. They are integrated circuits with large numbers of individual FETs manufactured on the operative surface of a single integrated-circuit (IC) die or chip. Since the FETs are all manufactured together, they all have nearly identical characteristics. Their sources are all interconnected, their drains are all interconnected, and their gates are all interconnected. Therefore, all of the FETs on a single IC function in parallel to form a three-terminal device capable of switching or controlling large amounts of current. A more detailed description of such a power FET can be obtained from Application Note 966A entitled *HEXFET III: A New Generation of Power MOSFETS* by D. Grant, published by International Rectifier Corporation, in the June, 1992 issue of its HEXFET Power MOSFET Designers' Manual (HDM-1, Vol. 1).

Sensing FETS (available from Motorola under the name "SENSEFET" and from International Rectifier under the name "HEXSense") are power FETs in which a few of the FETs on the IC chip have their sources connected to a fourth terminal (called the current sense terminal) of the device. The current sense terminal of a sensing FET corresponds to the sense terminal 31 of the semiconductor switch 27.

As current passes through the sources of the large majority of the FETs that constitute the main conduction path of the device, there is some conduction into the sources of the few FETs that are connected to the current sense terminal. Therefore, the current flowing through this current sense terminal is proportional to the current flowing through the main conduction path of the device. A more detailed understanding of such sensing FETs can be obtained from Application Note 959, entitled *An Introduction to the HEXSense (tm) Current-Sensing Device* by S. Clemente, H. Ishii, and S. Young, also published by International Rectifier Corporation in the June, 1992 issue of its HEXFET Power MOSFET Designers' Manual.

A diode 35, shown in FIG. 1A inside the semiconductor switch 27, is an internal body diode of the device and is normally back biased at less than its avalanche voltage and takes no part in the normal operation of the device.

A gate terminal 37 of the semiconductor switch 27 controls the formation and depth of the temporary conductive channels of the FETs of the semiconductor switch 27 by reason of the magnitude of the gate-to-source voltage.

A shunt resistor 39 serves to prevent the voltage supplied to the user circuit 15 from becoming negative while the transistor 74 is turned ON but before the semiconductor switch 27 is turned ON.

CURRENT SENSING CIRCUIT

The sense terminal 31 of the semiconductor switch 27 is connected to the negative (−) input of a differential amplifier 43. The positive input of the differential amplifier 43 is connected to the source terminal 29 of the semiconductor switch 27. The differential amplifier 43 is the focus of a current-to-voltage converter circuit 45. The output of the differential amplifier 43 is connected to a pull-up resistor 47 which provides positive voltage bias.

THE DIFFERENTIAL AMPLIFIER

A differential amplifier, such as the differential amplifier 43, is a commonly-available, five-terminal integrated-circuit device which has two power input terminals connected to plus and minus voltage source inputs such as the conductors 10 and 13. Two signal input terminals are labeled "+" and "−" or positive and negative. The fifth terminal is the amplifier's output.

The differential amplifier is of the open-collector type. That is, when its positive input terminal is at a more positive voltage than its negative input terminal, the output of the amplifier is an open circuit. A pull-up resistor, such as the resistor 47, is conventionally connected between the output of the differential amplifier and a source of positive voltage (such as the conductor 10) so that when the output of the differential amplifier is an open circuit, the pull-up resistor assures that the output of the amplifier will be at substantially the voltage of the positive voltage source.

However, when the negative input terminal of the differential amplifier experiences a more positive voltage than the voltage of its positive input terminal, the output of the amplifier turns ON and conducts current, thereby drawing current through the pull-up resistor and driving the output of the amplifier to a more negative voltage. In its normal operation, such a differential amplifier normally works with its two inputs at nearly the same voltage and produces wide swings of its output voltage in response to small changes in the relative voltages between its inputs.

THE CURRENT-LEVEL DETECTING CIRCUIT

Rather than put a series resistor in the main current path of the circuit, in order to measure the current flowing through the semiconductor switch 27, the current flowing through the semiconductor switch is sensed by the differential amplifier 43. The source terminal 29 of the semiconductor switch 27 is also connected to the positive input terminal of the differential amplifier 43 and serves as a reference voltage for the current measurement. The current flowing through the source areas of the semiconductor switch 27 that are connected to the source 29 causes current to flow through the source terminals of those few of the individual FETs of the semiconductor switch 27 that are connected to the sense terminal 31 and to the negative terminal of the differential amplifier 43.

As more current flows through the semiconductor switch 27, more current (by the positive convention) flows to the negative input terminal of the differential amplifier 43. That current flow tends to drive that negative input terminal more positive, with respect to its positive or reference input terminal. That tends to drive the output of the differential amplifier 43 more negative against the positive bias of the pull-up resistor 47, which is connected to the positive voltage supply conductor 10.

The output of the differential amplifier 43 is also connected to a feedback resistor 49, the other end of which is connected to the negative input of the differential amplifier 43. Therefore, as the output of the differential amplifier 43 becomes increasingly more negative, the feedback resistor 49 tends to draw off more of the sensing current from the negative input of the differential amplifier. That feedback effect tends to bias that negative input terminal of the differential amplifier 43 more negatively, against the positive bias of the current from the sense terminal 31. Therefore, the feedback resistor 49 tends partially to counteract the positive bias caused by the current from the sense terminal 31 of the semiconductor switch 27, thereby reducing the difference in the voltage of the two inputs of the differential amplifier 43. Consequently, the voltage, V1, between the reference at the conductor 30, which is connected to the source terminal 29 of the semiconductor switch 27, and the output of the differential amplifier 43 is inversely proportional to the magnitude of the current flowing through the semiconductor switch 27.

The output of the differential amplifier 43 is also connected to the positive input terminal of a differential amplifier 52. Therefore, the voltage supplied to the positive input terminal of the differential amplifier 52 is a voltage representative of the current passing through the semiconductor switch 27. The differential amplifier 52 is the focus of a gate-drive circuit 54 which functions as a voltage comparison circuit.

The gate-drive circuit 54 supplies control voltage to the control input terminal or gate 37 of the semiconductor switch 27, in order to control the turn-ON and turn-OFF transition of the voltage and current supplied on the conductor 30 to the user circuit 15. The output of the gate-drive circuit 54 is thus the result of a differential comparison of the output signals from the differential amplifier 43 and the signals supplied to the negative input terminal of the differential amplifier 52. In order to understand how and what input signals are supplied to the negative input terminal of the differential amplifier 52, reference is now made to the right-hand side of FIG. 1B.

THE POWERED BUT "OFF" STATE

Figure 2:
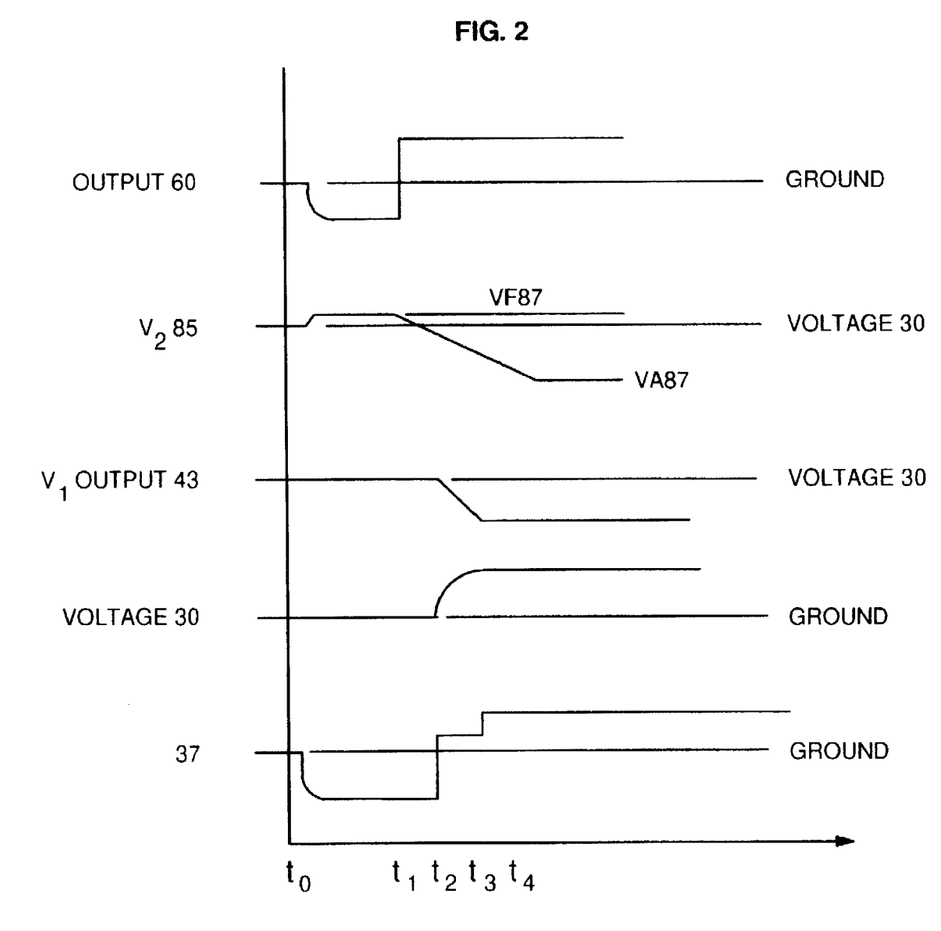
FIG. 2 is a series of timing diagrams illustrating the sequencing relationship between several points within the circuit of FIGS. 1A and 1B.

When the circuit board which includes the circuit of FIGS. 1A and 1B is first plugged into the larger circuit (not shown) at a time $t_0$, as shown on the abscissa or base of FIG. 2, the default condition is for the plus (+) power input of conductor 11 to be disconnected from the user circuit 15. Within a very short time ($t_1$ in FIG. 2) after the circuit board is plugged into the larger circuit, voltage transients (as shown at the beginning of the time period soon after the time $t_0$ in the waveforms labeled "37" and "OUTPUT 60" in FIG. 2), have occurred, and the conductors 10 and 13 are supplying voltage to the circuit of FIGS. 1A and 1B.

When no power is to be supplied to the user circuit 15, the semiconductor switch 27 is in its non-conductive or OFF state, as will be explained in detail below. Therefore, the conductor 30 is at zero-volt common or ground potential (see "VOLTAGE 30" at time $t_0$ in FIG. 2), as will be explained in detail below.

After the time $t_1$, the positive input of the differential amplifier 43 is at zero volts by reason of being connected to the source terminal 29 of the semiconductor switch 27 which is in turn connected to the conductor 30. However, the negative input of the differential amplifier 43 is drawn through the resistors 49 and 47 toward the positive voltage of the conductor 10. Therefore, the differential amplifier 43 is conducting current within its linear range such that its output is forced to zero volts. At that voltage, the feedback resistor 49 applies that zero voltage to the negative input of the differential amplifier 43.

The output of the differential amplifier 43, being at zero volts, applies zero volts to the positive input of the differential amplifier 52. As will be more fully described below, the negative input of the differential amplifier 52 is at a slight positive voltage when no voltage or current is to be supplied to the user circuit 15. Therefore, the gate 37 of the semiconductor switch 27 is drawn by the output of the differential amplifier 52 toward the negative voltage of the conductor 13 against the positive bias of the pull-up resistor 90. When its gate 37 is at nearly zero or a negative voltage, the semiconductor switch 27 is OFF and is substantially an open circuit between the plus (+) power input 11 and the substantially zero voltage of the conductor 30.

THE "ON/OFF" SIGNAL

An ON/OFF conductor 58 connects the positive input terminal of a differential amplifier 60 to a source (not shown) of external commands. Those external commands instruct the hot-plugging circuit of FIGS. 1A and 1B to connect the user circuit 15 to the positive (+) power input conductor 11 or to disconnect the user circuit from the positive (+) power input conductor, under careful voltage and current control. Those external commands are supplied to the positive input terminal of the differential amplifier 60 and are either more positive than or more negative than a reference voltage developed by a voltage divider circuit made up of two resistors 62 and 64.

The differential amplifier 60, with its negative input terminal connected to the voltage divider resistors 62 and 64, comprises a ramp-up, ramp-down control circuit 66. If the voltage of the ON/OFF conductor 58 is more positive than the reference voltage determined by the voltage divider resistors 62 and 64, positive (+) power input 11 voltage is to be supplied on the conductor 30 to the user circuit 15. However, if the voltage of the ON/OFF conductor is more negative than the reference voltage determined by the voltage divider resistors 62 and 64, the user circuit 15 is to be disconnected from the positive (+) power input 11 conductor. Alternatively, a forward-biased diode, one or more zener diodes, or even a primary or rechargeable battery can be used to generate the desired reference voltage.

The inclusion of an "ON/OFF" input control capability in a "hot-plugging" or "soft-switch" circuit lends a great flexibility advantage to the "soft-switch" system. When a binary "1" (more positive voltage) is applied to the ON/OFF input terminal or conductor 58, the "soft-switch" or "hot-plugging" circuit functions to turn voltage ON or to keep voltage on the user circuit 15. When a binary "0" (more negative voltage) is applied to the ON/OFF input terminal or conductor 58, the "soft-switch" circuit powers down or keeps supply voltage off of the circuitry of the user circuit 15.

With the use of an ON/OFF input, the "hot-plugging" or "soft-switch" circuit can also be used gently to power up and power down the circuitry of the user circuit 15, in order to minimize power usage during idle periods (ie., a "green" feature). Control at the ON/OFF input can be accomplished by manual switch, relay, software, etc.

Alternatively, a strap wire can be used to "hard-wire" the conductor 58 to the positive (+) voltage supply 10 in order to keep (+) power supplied to the user circuit 15 whenever the circuit board is plugged in. This will keep the soft switch in the turn-on or keep-on condition at all times. However, this will not gently power down the circuit board prior to unplugging. Such sudden change in the current usage of the larger circuit system could result in a voltage surge to the rest of the circuitry of the larger circuit system.

As another alternative, the strap wire can be mounted onto the connector (not shown) into which the supply conductors 10, 11, 12, and 13 are plugged, perhaps with slightly shorter connector land areas on the printed circuit board on which the hot-plugging circuit and the user circuit 15 are mounted. If the land area on the printed circuit board that is connected to the ON/OFF control terminal or conductor 58 is slightly shorter than the other land areas, power down can be triggered at a point just at the start of the extraction of the circuit board, as with some of the prior art examples, including those that use specially-made plug connectors.

Normally, the binary signal present at the ON/OFF terminal or conductor 58 is biased (means not shown, but by a bias resistor to the conductor 13, for example) to a more negative voltage or default binary "0" state and is only changed to a more positive voltage or binary "1" when the printed circuit board with the hot-plugging circuit and the user circuit 15 is fully plugged into the connector and is to be energized. The preferred mode of controlling the voltage present at the ON/OFF terminal or conductor 58 is to employ program control through the larger circuit system (not shown) or under combined manual and software control by a laptop or other PC used as the human interface to the larger circuit system. In this way, the "soft-switch" can power the user circuit 15 up only after insertion and for operation on demand and can power the user circuit 15 down for an idle period ("green") and in anticipation of printed circuit board extraction.

Alternatively, the ON/OFF conductor 58 can be connected to the extraction lever (not shown) of the circuit board that includes both the user circuit 15 and the "soft-switch" or "hot-plugging" circuit of FIGS. 1A and 1B. Such extraction levers are common on one or both outboard corners of a large circuit board (not shown), opposite the connector or inboard end of the circuit board.

The idle or closed position of the extraction lever puts a binary "1" onto the ON/OFF conductor 58 whenever circuit board insertion pushes the extraction lever against the outboard end of the circuit board, whenever the circuit board is fully inserted. When the extraction lever is manually moved, in order to extract the circuit board, manual movement of the extraction lever puts a binary "0" onto the ON/OFF conductor, in order to power down the circuit board before the circuit board is fully removed from its connector to the larger circuit system.

VOLTAGE RAMP GENERATOR

After the circuit board including the hot-plugging circuit has been plugged into the larger circuit (not shown), the negative input terminal of the differential amplifier 60 is always at the voltage determined by the voltage divider of resistors 62 and 64. When the ON/OFF conductor 58 (connected to the positive input terminal of the differential amplifier 60) is at a more negative voltage than the negative input terminal of the differential amplifier, the "hot-plugging" circuit is to be OFF; and the output of the differential amplifier 60 is in the electrically conductive condition, conducting current between its output terminal and the negative voltage of the conductor 13. Therefore, the output terminal of the differential amplifier 60 is strongly drawn toward the negative voltage of the conductor 13 when the ON/OFF conductor 58 is held at the binary 0 or negative voltage.

The output of the differential amplifier 60 of the ramp-up, ramp-down control circuit 66 is the principal control input of a voltage ramp generator circuit 70. The foci of the voltage ramp generator circuit 70 are two conventional bipolar transistors 72 and 74, which are interconnected in series, at their collectors, are preferably turned ON alternatively and not simultaneously, and are arranged to function as switchable constant-current sources.

The transistors 72 and 74 have emitter resistors 76 and 78, respectively. Therefore, the current flowing through each transistor is controlled substantially by the voltage of its collector, the resistance of its emitter resistor, and the voltage of its base terminal. The base terminals of the transistors 72 and 74 are connected to a pair of series-connected voltage dividers made up of four resistors 80, 81, 82, and 83.

After electrical power has been made available to the conductors 10, 11, 12, and 13 but the ON/OFF conductor 58 is still held at a more negative (binary 0) voltage (during the period $t_0$ to $t_1$ in FIG. 2), the differential amplifier 60 holds the junction between the resistors 81 and 82 toward the negative voltage of the conductor 13. Therefore, the transistor 72 is conducting current while the transistor 74 is essentially non-conducting, turned OFF. This conductive condition of the transistor 72 draws current through the emitter resistor 76. However, the transistor 72 is not sufficiently biased in the negative direction to saturate and is in its linear condition in which it is sustaining substantial collector-emitter voltage.

The resistors 76, 80, and 81, along with the gain of the transistor 72 assure that the common collectors are at a positive voltage—closer to the voltage of the conductor 10 than the voltage of the conductor 13—when the transistor 72 is conducting and the transistor 74 is not conducting. However, as noted below, the common collectors are not free to migrate to a voltage much more positive than ground or common voltage.

The interconnected collectors of the two current-source transistors 72 and 74 are connected to a voltage-ramping capacitor 85, the anode of a zener diode 87, and to the negative input terminal of the differential amplifier 52, within the gate-drive circuit 54. The positive voltage at the anode of the zener diode 87 causes it to be forward biased, in which condition it will support only a very small voltage difference (usually less than one volt). The cathode of the zener diode 87 is connected to the conductor 30 which is directly connected to the positive (+) voltage supply bus (not shown) within the user circuit 15.

The current flowing through the zener diode 87 is extremely small compared with the functional current that the user circuit 15 would draw if fully powered. Therefore, to such a small current, the user circuit 15 is virtually a short circuit to ground or zero volts. Therefore, the conductor 30, the source terminal 29 of the semiconductor switch 27, one terminal of the voltage-ramping capacitor 85, and the cathode of the zener diode 87 are all at or near ground or zero volts. Therefore, the ON transistor 72 charges the voltage-ramping capacitor 85 to the forward-conduction voltage of the zener diode 87, which then conducts and prevents further charging of the voltage-ramping capacitor. This is shown as the short, positive-going ramp in the waveform "$V_2$ 85" in FIG. 2, shortly after $t_0$. Note that in FIG. 2, the waveforms "$V_2$ 85" and "$V_1$ OUTPUT 43" are referenced to the voltage of the conductor 30 and not to zero volts or ground, as are the other waveforms of FIG. 2.

As described above, the positive input terminal of the differential amplifier 52 is held at very nearly zero volts by the output of the differential amplifier 43. The negative input of the differential amplifier 52 is held at a slightly more positive voltage (no more than about +1 volt, the forward voltage drop through the zener diode 87) by the transistor 72, which has charged the ramp-generating capacitor 85 until the zener diode 87 has become forward biased. Therefore, the output of the differential amplifier 52 is ON strongly, with its output held at substantially the negative voltage of the conductor 13, against the bias of the pull-up resistor 90.

The output of the differential amplifier 52 holds the gate 37 of the semiconductor switch 27 at nearly the negative voltage of the conductor 13, at which voltage there is no conductive channel formed within the semiconductor switch 27 and it is in its OFF or non-conducting condition, and no substantial current or voltage is available on the conductor 30 for the user circuit 15.

However, when it is desired at the time $t_1$ (FIG. 2) to supply operating voltage and current to the user circuit 15, the ON/OFF conductor 58 is changed to a substantially more positive voltage. Therefore, the output terminal of the differential amplifier 60 becomes an open circuit. The voltages of the base terminals of the transistors 72 and 74 are then controlled by the ratios of the resistances of the four resistors 80, 81, 82 and 83. The resistance values of those four base-bias resistors are selected to cause the transistor 74 to turn ON and become conductive and cause the transistor 72 to turn OFF and become non-conductive.

That difference in current flow through the transistors 72 and 74 tends to draw the interconnected collectors toward the negative voltage of the conductor 13. The constant current flow through the transistor 74 tends to charge the voltage-ramping capacitor 85 in the negative direction but at a linear rate by reason of the current source connection of the transistor 74. See the negative-going ramp in the waveform "$V_2$ 85" in FIG. 2, between the times $t_1$ and $t_4$. The zener diode 87 first ceases to be forward biased and then becomes increasingly back biased as the voltage-ramping capacitor 85 continues to charge negatively. When the zener diode 87 reaches its avalanche voltage, at time $t_4$, it clamps the voltage-ramping capacitor 85 at that voltage.

THE TURN-ON TRANSIENT

Soon after time $t_1$, the voltage at the negative input of the differential amplifier 52 reaches the zero-volt level of its positive input (at time $t_2$). The differential amplifier 52 then enters its linear region and tries to become non-conductive. That allows the pull-up resistor 90 to pull the gate 37 of the semiconductor switch 27 to a positive voltage. At that point, a conductive channel forms within each FET area of the semiconductor switch 27, and current flows from the positive (+) power input 11 to the conductor 30 and on to the user circuit 15.

A stabilizing capacitor 92 is connected between the output of the differential amplifier 52 and its negative input to stabilize the current control loop of the differential amplifier 43 and lower the frequency bandpass of the circuit to below any expected oscillation frequencies, to keep the differential amplifier 43 from oscillating.

As soon as the conductive channels begin to form in the semiconductor switch 27, two things happen at the inputs of the differential amplifier 43. As soon as the voltage of the source terminal 29 of the semiconductor switch 27 starts to become more positive, it makes both the conductor 30 and the positive input of the differential amplifier 43 more positive. As soon as current begins to flow through the semiconductor switch, charges begin flowing through the hot-sense terminal 31 of the semiconductor switch. Those charges cause the negative input of the differential amplifier to become more positive.

In practice, the negative input of the differential amplifier 43 tries to become more positive faster than its positive input. That causes the output of the differential amplifier 43 to become more conductive and more negative, which lowers the voltage of the right-hand terminal of the feedback resistor 49. The feedback resistor 49 then slows the positive voltage rise of the negative input of the differential amplifier 43 in order to keep its two inputs at nearly the same voltage.

Consequently, the output voltage of the differential amplifier 43 starts a negative migration (see waveform "$V_1$ OUTPUT 43" of FIG. 2, between $t_2$ and $t_3$) with respect to the positive migration of the voltage of the conductor 30 (see waveform "VOLTAGE 30" of FIG. 2). The negative migration of the output voltage of the differential amplifier 43 is applied to the positive input of the differential amplifier 52 to tend to keep the output of the differential amplifier 52 within its linear region.

Also, the positive migration of the voltage of the conductor 30 tends to reduce or slow (with respect to ground or zero volts) the negative migration of the voltage of the negative input of the differential amplifier 52, as the voltage ramping capacitor 85 experiences a steady charging (with respect to the conductor 30) in the negative direction. Both of these voltage migrations at the two inputs of the differential amplifier 52 tend to stabilize its output voltage - and thus the voltage of the gate 37 of the semiconductor switch 27.

Therefore, the voltage of the conductor 30 (see FIG. 2) rises in a controlled manner, while the current through the conductor 30 also rises in a controlled manner. The controlled rise of the current in the conductor 30 results from the operation of the differential amplifier 43 on the positive input of the differential amplifier 52. The controlled rise of the voltage in the conductor 30 results from the operation of voltage feedback through the voltage-ramping capacitor 85 to the negative input of the differential amplifier 52. Of course, as previously more fully explained, the current rise and the voltage rise in the conductor 30 are inextricably connected with the combination of the influences on both of the inputs of the differential amplifier 52.

When the voltage of the conductor 30 reaches the voltage of the plus (+) power conductor 11 and the current through the conductor 30 reaches substantially a stable value, the output of the differential amplifier 43 ceases its negative voltage migration with respect to the voltage of the conductor 30, as shown at the time $t_3$ on the waveform "$V_1$ OUTPUT 43" of FIG. 2. The continued negative ramping of the voltage across the capacitor 85 makes the negative input of the differential amplifier 52 more negative than its positive input. That makes the output of the differential amplifier 52 non-conductive. The pull-up resistor 90 then quickly changes the voltage of the gate 37 of the semiconductor switch 27 significantly more positive. See time $t_3$ of waveform "37" of FIG. 2. When the gate 37 thus becomes still more positive, that greatly deepens the conductive channel paths within the FETs of the semiconductor switch, causing it to saturate and become an extremely low-resistance current path.

The negative ramping migration of the voltage across the voltage-ramping capacitor 85 continues until the zener diode 87 reaches its avalanche voltage and clamps the voltage-ramping capacitor 85. See waveform "$V_2$ 85" of FIG. 2 at time $t_4$. At this point, the voltage of the plus (+) power source is firmly connected to the user circuit 15; and the hot-plugging circuit of FIGS. 1A and 1B has done its work and is in its steady-state ON condition. However, the circuit of FIGS. 1a and 1B has one more service to perform for the operating user circuit.

This service is connected with the use of the zener diode 87 to limit the maximum negative voltage that can be reached by the voltage-ramping capacitor 85. The avalanche voltage of the zener diode 87 is chosen so as to limit the maximum positive voltage that can be placed on the gate 37 of the semiconductor switch 27. By thus limiting the positive voltage on the gate 37, the maximum conductivity of the semiconductor switch 27 is limited. Therefore, the semiconductor switch 27 becomes a form of current source which has substantially no source-to-drain impedance as long as it is conducting less current than would be dictated by the voltage of its gate 37. However, when there is demand by the user circuit for more current than would be dictated by the voltage of the gate 37, the semiconductor switch 27, as would any current source, reduces its apparent conductivity and thus its output voltage in order to limit it current conduction to that fixed by the voltage to which its gate 37 has been clamped by the zener diode 87.

UNDERVOLTAGE DETECT AND LATCH CIRCUIT

When too low a voltage is available to the user circuit 15 at any time other than during a normal voltage ramp-up—as when a defective user circuit 15 draws too much current—it is desirable entirely to turn OFF the voltage to the user circuit, thereby forestalling spurious inaccurate operation. Therefore, the conductor 30 is connected to the positive input of a differential amplifier 94 which is the focus of an undervoltage detect and latch circuit 95.

The purpose of the undervoltage circuit 95 is to detect when the voltage of the conductor 30 drops below a preset minimum determined by the resistance values chosen for two resistors 97 and 98 which form a voltage divider which sets a reference voltage below which the voltage of the conductor 30 should not fall. The outer terminals of the resistors 97 and 98 are connected to the conductors 10 and 13, respectively, and define the desired reference voltage level at their interconnection, which is then available at the negative input of the differential amplifier 94.

As long as the voltage of the conductor 30 is more positive than the voltage-divider reference voltage at the negative input of the differential amplifier 94, the output of that differential amplifier is an open circuit. The output of the differential amplifier 94 is connected to the gate 37 of the

13 semiconductor switch 27 and has no effect on the semiconductor switch as long as the output of the differential amplifier 94 is an open circuit.

When the voltage of the conductor 30 (and with it the positive input of the differential amplifier 94) becomes more negative than the reference voltage at the negative input of the differential amplifier, the output of the differential amplifier (and with it the gate terminal 37 of the semiconductor switch 27) turns ON and pulls the voltage of the gate terminal 37 of the semiconductor switch toward the negative voltage of the conductor 13, against the bias of the pull-up resistor 90. This tends to turn OFF the semiconductor switch 27, cutting off current on the conductor 30, to protect the circuit from an undervoltage condition.

To prevent the undervoltage circuit 95 from holding the semiconductor switch 27 OFF for all time, a diode 100 is connected between the output of the differential amplifier 60 to the negative input of the differential amplifier 94. Therefore, whenever the ON/OFF conductor 58 is at a low voltage (a binary 0 condition for turning or holding the semiconductor switch OFF), the output of the differential amplifier 60 is held at the negative voltage of the conductor 13. When the output of the differential amplifier 60 is held negative, it also holds negative the cathode of the diode 100 and the negative input of the differential amplifier 94. Therefore, when the ON/OFF conductor 58 is low, the undervoltage circuit 95 is disabled.

When the ON/OFF conductor 58 changes to a positive or binary 1 voltage, in order to turn ON the semiconductor switch 27, the output of the differential amplifier becomes an open circuit. An open-circuited output of the differential amplifier 60 permits the voltage of the cathode of the diode 100 to be at a substantially more positive voltage, determined by the resistors 80, 81, 82, and 83.

If the positive input of the differential amplifier 94 were to assume such a high positive voltage immediately, it could hold the semiconductor switch 27 in its OFF condition indefinitely. Therefore, a capacitor 102 is connected between the negative input of the differential amplifier 94 and the conductor 13. The purpose of the capacitor 102 is to prevent the resistors 97 and 98 from raising the voltage of that negative input too rapidly. Therefore, the more-positive reference voltage determined by the resistors 97 and 98 is not available at the negative input of the differential amplifier 94 until after the voltage on the conductor 30 has had an opportunity to rise to the voltage of the plus (+) power source.

The resistance of the resistors 97 and 98 and the capacitance of the capacitor 102 are all chosen to achieve a desired resistive-capacitive (RC) rate of voltage increase of the voltage at the negative input of the differential amplifier 94. That rate of increase is calculated to be such that in the normal operation of the turn-on transient with a properly-functioning user circuit 15, the voltage of the negative input of the differential amplifier 94 will rise more slowly than the voltage of the conductor 30 and with it the positive input of the differential amplifier 102. Therefore, in the normal situation, the differential amplifier 94 will not become conductive.

However, if the user circuit 15 begins drawing more current than it should, the rate of current rise in the conductor 30 and the positive input of the differential amplifier 94 slows significantly. Under that condition, the voltage of the negative input of the differential amplifier 94 rises faster than the negative voltage. The differential amplifier 94 becomes conductive and turns OFF the semiconductor switch 27.

14

THE TURN-OFF TRANSITION

In order to use the ON/OFF input feature to turn OFF the semiconductor switch 27 in a controlled manner for either a "green" mode or for extracting the printed circuit board which includes the user circuit 15, the ON/OFF conductor 58 is changed from a substantial positive or high voltage (binary 1) to a substantially more negative or low voltage (binary 0). That turns ON the output of the differential amplifier 60 which turns OFF the transistor 74 and makes the transistor 72 conductive. When the transistor 72 becomes conductive, it and its associated resistors become a current source charging the voltage-ramping capacitor 85 in a positive direction.

Very shortly thereafter, the positive-going lower terminal (as viewed in FIG. 1B) of the voltage-ramping capacitor 85 tries to change the voltage at the negative input of the differential amplifier 52 to a voltage that is more positive than its positive input. Therefore, the differential amplifier 52 enters its linear condition in which its input terminals stay at nearly the same voltage and migrate in a positive direction as the charge on the voltage-ramping capacitor 85 ramps in the positive direction.

As the differential amplifier 52 begins to conduct output current, it draws the gate terminal 37 of the semiconductor switch 27 to a less positive voltage, thus tending to turn the semiconductor switch OFF. As the semiconductor switch 27 becomes less conductive, the current through it lessens and the voltage of the conductor 30 becomes less positive. The less positive voltage of the conductor 30 tends to reduce the rate of change of the positive going voltage at the negative input of the differential amplifier 52 and at the lower terminal of the voltage-ramping capacitor 85.

The reduced current through the semiconductor switch 27 tends to reduce the current through the feedback resistor 49, thereby making the negative input of the differential amplifier 43 less positive. That change in voltage of the negative input would tend to make the output of the differential amplifier 43 less conductive. However, the feedback resistor 49 tends to slow that effect. Meanwhile, the reduction in the positive voltage of the conductor 30 and the source 29 of the semiconductor switch 27 tends to make the positive input of the differential amplifier 43 become less positive. The result is a gradual increase in the voltage of the output of the differential amplifier 43—and also of the positive input of the differential amplifier 52. With the positive input and the negative input of the differential amplifier 52 both becoming more positive but at different rates, the negative migration of the gate 37 is maintained at a gradual, controlled rate.

Finally, the semiconductor switch 27 turns OFF and the conductor 30 is at ground or zero volts. At that point, the lower terminal of the voltage-ramping capacitor becomes more positive than the conductor 30 until the zener diode 87 becomes forward biased, conducts and clamps the voltage of the voltage-ramping capacitor 85.

The negative input of the differential amplifier 43 is being strongly drawn toward the voltage of the conductor 10 by the pull-up resistor 47 through the feedback resistor 49. Meanwhile the positive input of the differential amplifier 43 is held at substantially the ground or zero voltage of the conductor 30. Therefore, the output of the differential amplifier 43 conducts sufficiently to draw the junction of the resistors 47 and 49 (and with it, the negative input of the differential amplifier) to substantially the ground or zero-volt condition of the conductor 30. Therefore, the positive input of the differential amplifier 52 is also at ground or zero volts.

Since the negative input of the differential amplifier 52 is more positive than its positive input, the output of the differential amplifier 52 conducts strongly and draws the gate 37 to the negative voltage of the conductor 13, against the bias of the pull-up resistor 90. With its gate 37 at a very negative voltage, the semiconductor switch 27 is held OFF. The user circuit 15 has been powered down and the printed circuit board can now be extracted from the larger circuit.

While the form of apparatus herein described constitutes a preferred embodiment of this invention, it is to be understood that the invention is not limited to this precise form of apparatus, and that changes may be made therein without departing from the scope of the invention which is defined in the appended claims.

I claim:

1. A hot-plugging circuit for use with a printed circuit board, to control voltage and current supplied to a user circuit on the printed circuit board having operational voltage supply conductors and a common return conductor, a power supply conductor, and a voltage control circuit including a semiconductor switch having a control input terminal for controlling conductivity of the semiconductor switch, said semiconductor switch being arranged selectively to conduct electrical current so as to connect the operational voltage supply to the user circuit for controlling the voltage and current from the operational voltage supply conductor that is supplied to the user circuit, said voltage control circuit characterized by:

a power on/off control conductor, the voltage applied thereto controlling whether the semiconductor switch is to be conductive or non-conductive;

said semiconductor switch having a current-sensing terminal that carries a current proportional to the current passing through the semiconductor switch;

a current-level-detecting circuit responsive to the current carried by the current sensing terminal for generating a voltage proportional to that current passing through the semiconductor switch;

a voltage-ramp-generating circuit for generating a voltage difference of substantially linearly-changing value over time during a transition period after a change in the state of the voltage applied to the power on/off control conductor; and a voltage comparison circuit for comparing the voltage of the voltage-ramp generating circuit and the current-level-detecting circuit for generating a turn-ON current transition signal applied to the control input terminal of the semiconductor switch, whereby the change of the current passing through the semiconductor switch to the user circuit follows substantially a linear current ramp.

2. A hot-plugging circuit according to claim 1, wherein the voltage-ramp generating circuit comprises a current source circuit charging a capacitor, the voltage of one terminal of which constitutes at least a part of the control of the conductivity of the semiconductor switch at the control input terminal of the semiconductor switch.

3. A hot-plugging circuit according to claim 2, wherein the current source comprises emitter-follower circuit, the conductivity of which is controlled by a voltage divider, connected between at least a portion of the supply voltage and a component controlled by the on/off control conductor.

4. A hot-plugging circuit according to claim 1, further comprising means for sharply reducing the conductivity of the semiconductor switch in the presence of a low-voltage condition on the operational voltage supply conductor on which power is supplied to the user circuit.

5. A hot-plugging circuit according to claim 4, wherein the means for reducing the conductivity of the semiconductor switch is arranged to disregard the voltage of the operational voltage supply conductor until the voltage-ramp generating circuit has had sufficient opportunity to reach a voltage sufficient to cause the semiconductor switch to reach saturation.

6. A hot-plugging circuit according to claim 5, wherein the means for reducing the conductivity of the semiconductor switch is arranged to raise a threshold of what constitutes a low-voltage condition at the semiconductor switch at a rate less than the expected rate of rise of the voltage of the operation voltage supply conductor.

7. A hot-plugging circuit according to claim 1, further including a voltage threshold circuit for sensing the voltage condition of the power on/off control conductor, comprising:

a voltage divider circuit for generating a reference voltage;

a differential amplifier having one input connected to the reference voltage;

the other input of the differential amplifier connected to the power on/off control conductor; and the output of the differential amplifier connected to the voltage-ramp generating circuit for controlling the level of the current supplied by the voltage ramp generating circuit.

8. A transient-current and transient-voltage control circuit for controlling the rate at which voltage and current are supplied to and withdrawn from a user circuit from a voltage source on an operational voltage supply conductor, comprising:

a semiconductor switch connected between the voltage source and the operational voltage supply conductor and having an operational current flow path and a control electrode for controlling the resistivity of the path;

an ON/OFF control means responsive to an ON/OFF input signal level for controlling whether voltage and current power is or is not to be supplied from the voltage source to the user circuit on the operational voltage supply conductor;

a voltage ramping means for generating a relative voltage level output that changes linearly, in response to a change in the ON/OFF control, and at least partly controls the level of voltage supplied on the operational voltage supply conductor to the user circuit;

current sensing means for sensing the magnitude of current passing through the operational current flow path of the semiconductor switch to the operational voltage supply conductor and for generating a relative voltage level output in response to the magnitude of the current level sensed; and control signal means for comparing the voltage from the voltage ramping means and the current sensing means for generating a control signal in response to that comparison and for applying that control signal to the control electrode of the semiconductor switch.

9. A transient-current and transient-voltage control circuit according to claim 8 wherein:

the semiconductor switch has a sensing terminal which receives charges at a rate proportional to the current flow through an operational current flow path of the semiconductor switch; and the current sensing means comprises a comparison circuit for comparing the voltage supplied to the user circuit on the operational voltage supply conductor with a voltage representative of the rate of flow of charges from the sensing terminal to the output of the comparison circuit.

10. A transient-current and transient-voltage control circuit according to claim 9 wherein said control signal means comprises:

a voltage comparing circuit having two inputs and an output;

one input of said voltage comparing circuit connected to the voltage level output of the current sensing means;

the other input of said voltage comparing circuit connected to the voltage level output of the voltage ramping means; and the output of the voltage comparing circuit connected to the control electrode of the semiconductor switch.

11. A transient-current and transient-voltage control circuit according to claim 9 wherein the voltage ramping means comprises:

a two-terminal capacitor, one terminal of which is connected to the operational voltage supply conductor;

a constant-current source circuit controlled by the ON/OFF control means for supplying a substantially constant current to the other terminal of the two-terminal capacitor; and means for clamping the voltage across the two-terminal capacitor to a value substantially below the voltage supplied to the current source circuit.

12. A transient-current and transient-voltage control circuit according to claim 11 wherein the ON/OFF control means comprises:

means for establishing a reference voltage level; and means for comparing the voltage level of the input signal level with the reference voltage level and for controlling the operation of the constant-current source circuit in response thereto.

13. A transient-current and transient-voltage control circuit according to claim 12 wherein said control signal means comprises:

a voltage comparing circuit having two inputs and an output;

one input of said voltage comparing circuit connected to the voltage level output of the current sensing means;

the other input of said voltage comparing circuit connected to the voltage level output of the voltage ramping means; and the output of the voltage comparing circuit connected to the control electrode of the semiconductor switch.

14. A transient-current and transient-voltage control circuit according to claim 8 further comprising:

undervoltage means for sensing if the voltage applied to the user circuit on the operational voltage supply conductor is less than a predetermined value and for controlling the control electrode of the semiconductor switch to turn OFF the semiconductor switch in response to sensing less than said predetermined value; and means for disabling the undervoltage means to disable the undervoltage means when the ON/OFF control means is directing that voltage and current not be supplied from the voltage source to the user circuit and for controlling the rate of voltage rise of the voltage-sensing threshold of the undervoltage means during transition period after the ON/OFF control directs that voltage is to be supplied from the voltage source to the user circuit.

15. A transient-current and transient-voltage control circuit according to claim 8 wherein the voltage ramping means comprises:

a two-terminal capacitor, one terminal of which is connected to the operational voltage supply conductor;

a constant-current source circuit controlled by the ON/OFF control means for supplying a substantially constant current to the other terminal of the two-terminal capacitor; and means for clamping the voltage across the two-terminal capacitor to a value substantially below the voltage supplied to the current source circuit.

16. A transient-current and transient-voltage control circuit according to claim 15 wherein the ON/OFF control means comprises:

means for establishing a reference voltage level; and means for comparing the voltage level of the input signal level with the reference voltage level and for controlling the operation of the constant-current source circuit in response thereto.

17. A transient-current and transient-voltage control circuit according to claim 8 wherein said control signal means comprises:

a voltage comparing circuit having two inputs and an output;

one input of said voltage comparing circuit connected to the voltage level output of the current sensing means;

the other input of said voltage comparing circuit connected to the voltage level output of the voltage ramping means; and the output of the voltage comparing circuit connected to the control electrode of the semiconductor switch.

18. A printed-circuit board including an card-edge connector, a user circuit and a hot-plugging circuit to control voltage and current supplied to the user circuit on the printed circuit board, the hot-plugging circuit having operational voltage supply conductors and a common return conductor, a power supply conductor, and a voltage control circuit including a semiconductor switch having a control input terminal for controlling the conductivity of the semiconductor switch, said semiconductor switch being arranged selectively to conduct electrical current so as to connect the operational voltage supply to the user circuit for controlling the voltage and current from the operational voltage supply conductor that is supplied to the user circuit, said voltage control circuit characterized by:

a power on/off control conductor, the voltage applied thereto controlling whether the semiconductor switch is to be conductive or non-conductive;

said semiconductor switch having a current-sensing terminal that carries a current proportional to the current passing through the semiconductor switch;

a current-level-detecting circuit responsive to the current carried by the current sensing terminal for generating a voltage proportional to that current passing through the semiconductor switch;

a voltage-ramp-generating circuit for generating a voltage difference of substantially linearly-changing value over time during a transition period after a change in state of the voltage applied to the power on/off control conductor; and a voltage comparison circuit for comparing the voltage of the voltage-ramp generating circuit and the current-level-detecting circuit for generating a turn-ON current transition signal applied to the control input terminal of the semiconductor switch, whereby the change of the current passing through the semiconductor switch to the user circuit follows substantially a linear current ramp.

19. A printed-circuit board according to claim 18, wherein the voltage-ramp generating circuit comprises a current source circuit charging a capacitor, the voltage of one terminal of which constitutes at least a part of the control of the conductivity of the semiconductor switch at its control input terminal.

20. A printed-circuit board according to claim 19, wherein the current source comprises emitter-follower circuit, the conductivity of which is controlled by a voltage divider, connected between at least a portion of the supply voltage and a component controlled by the on/off control conductor.

21. A printed-circuit board according to claim 18, further comprising means for sharply reducing the conductivity of the semiconductor switch in the presence of a low-voltage condition on the operational voltage supply conductor on which power is supplied to the user circuit.

22. A printed-circuit board according to claim 21, wherein the means for reducing the conductivity of the semiconductor switch is arranged to disregard the voltage of the operational voltage supply conductor until the voltage-ramp generating circuit has had sufficient opportunity to reach a voltage sufficient to cause the semiconductor switch to reach saturation.

23. A printed-circuit board according to claim 22, wherein the means for reducing the conductivity of the semiconductor switch is arranged to raise a threshold of what constitutes a low-voltage condition at the semiconductor switch at a rate less than the expected rate of rise of the voltage of the operation voltage supply conductor.

24. A printed-circuit board according to claim 18, further including a voltage threshold circuit for sensing the voltage condition of the power on/off control conductor, comprising:

a voltage divider circuit for generating a reference voltage;

a differential amplifier having one input connected to the reference voltage;

the other input of the differential amplifier connected to the power on/off control conductor; and the output of the differential amplifier connected to the voltage-ramp generating circuit for controlling the level of the current supplied by the voltage ramp generating circuit.

* * * * *